United States Patent [19]

Ahmed

[11] 4,198,581
[45] Apr. 15, 1980

[54] TEMPERATURE COMPENSATING COMPARATOR

[75] Inventor: Adel A. A. Ahmed, Annandale, N.J.

[73] Assignee: RCA Corporation, New York, N.Y.

[21] Appl. No.: 841,966

[22] Filed: Oct. 13, 1977

[51] Int. Cl.² .......................................... H03K 17/90
[52] U.S. Cl. .............................. 307/310; 307/296 R; 307/308; 330/256
[58] Field of Search ............... 307/308, 254, 310, 296, 307/355; 330/256, 361

[56] References Cited

U.S. PATENT DOCUMENTS

| | | | |
|---|---|---|---|
| 2,871,376 | 1/1959 | Kretzer | 307/310 |
| 3,188,576 | 6/1965 | Lewis, Jr. | 330/256 |

*Primary Examiner*—Stanley D. Miller, Jr.
*Assistant Examiner*—B. P. Davis
*Attorney, Agent, or Firm*—Eugene M. Whitacre; Paul J. Rasmussen; William H. Meise

[57] ABSTRACT

An emitter-coupled differential comparator compares a horizontal rate ramp signal with a vertical-frequency parabola in a television context for producing horizontal rate pulses duration-modulated at the vertical rate. The comparator is arranged to compensate for a temperature-dependent differential-mode component of the signal sources. The compensation is provided by a temperature-responsive element coupled in the emitter circuit of one of the emitter coupled transistors.

11 Claims, 3 Drawing Figures

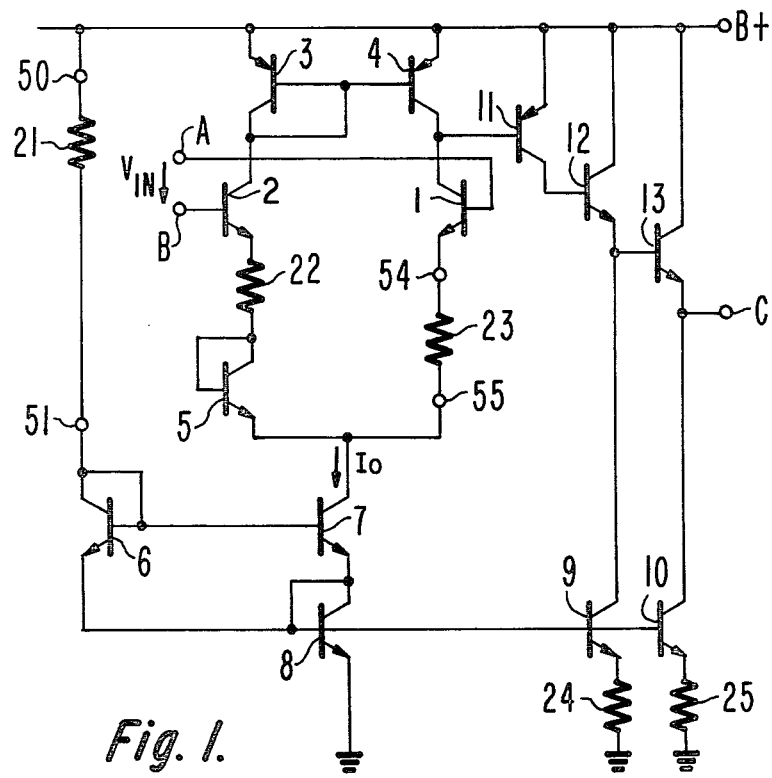
Fig. 1.
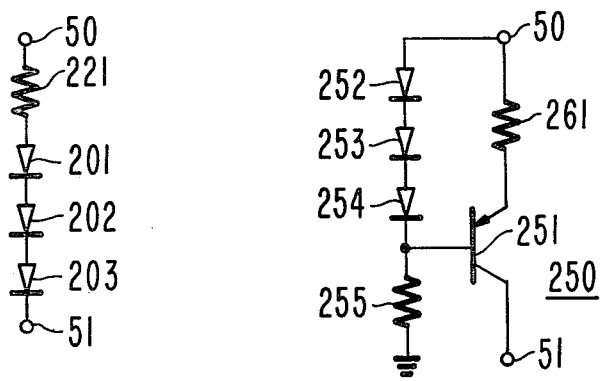
Fig. 2a. 200
Fig. 2b.
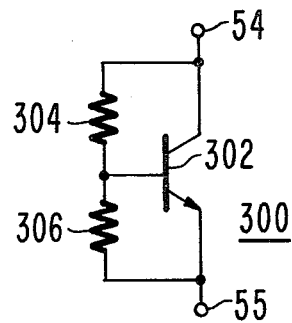
Fig. 3.

TEMPERATURE COMPENSATING COMPARATOR

This invention relates to a comparator which compensates for a differential-mode relative component between the signal sources being compared, and is useful as a pulse width modulator in a television pincushion correction circuit.

A switch pincushion correction circuit is described in U.S. Pat. No. 4,088,931 issued May 9, 1978 to Peter Eduard Haferl and entitled "PINCUSHION CORRECTION CIRCUIT," in which an impedance coupled in series with the horizontal deflection coils is paralleled by a controllable switch. The switch is closed at a time during each recurrent horizontal retrace interval which is progressively varied over the vertical scanning interval. At the top and at the bottom of the vertical scanning interval, the switch is gated on relatively late during the horizontal retrace interval, which causes a relatively high average impedance in series with the horizontal deflection coils and thereby reduces scanning current and corrects pincushion. In the center of the vertical scanning interval, the switch is gated on relatively earlier, with the result that increased horizontal scanning current results from the lower average impedance in series with the deflection winding.

As described in U.S. Pat. No. 4,101,814 issued July 18, 1978 to Peter Eduard Haferl and entitled "SIDE PINCUSHION DISTORTION CORRECTION CIRCUIT," pulse duration modulation gating pulses for the controllable pincushion correction switch are produced by a comparator. One input of the comparator is coupled to an integrator which forms a vertical-rate parabola from a vertical-rate sawtooth. The other input of the comparator is coupled a source of horizontal-rate ramp signals by way of a circuit including a width control. The presence of the width control causes an uncompensated differential-mode temperature-responsive component at the second comparator input.

It is customary in comparator practice to compensate the sources driving the comparator against differential-mode temperature changes. However, this may result in other undesirable effects, such as degraded "feel" or action of the control.

SUMMARY OF THE INVENTION

An emitter coupled differential comparator which compensates for changes in switching point resulting from a temperature-responsive differential-mode component existing between the sources being compared comprises first and second transistors each having a base electrode coupled to a respective one of the signal sources. A current source is coupled to the emitters of the first and second transistors by two current paths. The collector electrodes of the transistors are coupled to energization and utilization circuits. A temperature-responsive conductor is coupled in one of the emitter current paths and produces a component poled to reduce the temperature-dependent changes in switching point

DESCRIPTION OF THE DRAWINGS

FIG. 1 is a schematic diagram of a comparator embodying the invention; and

FIGS. 2 and 3 illustrate circuits which may be used in conjunction with the arrangement of FIG. 1.

DESCRIPTION OF THE INVENTION

In FIG. 1, transistors 1 and 2 have their bases connected respectively to input terminals A and B. While the voltages at terminals A and B may be set equal at a particular temperature, the voltage at terminal B relative to that at terminal A has a Vbe-related component. This may result in an unwanted shift in the relative switching point of comparator 60 with temperature. The emitter of transistor 1 is connected through a resistor 23 to the collector of a current source transistor 7. The emitter of transistor 2 is coupled through a series coupled resistor 22 and diode-connected transistor 5 to the collector of transistor 7. The collector of transistor 2 is coupled to B+ through a diode connected transistor 3. Diode 3 is coupled across the base-emitter junction of a transistor 4, the collector of which is coupled to the collector of transistor 1. The collector of transistor 1 is also coupled to the base of a transistor 11, the emitter of which is coupled to B+. The collector of transistor 11 is coupled to the base of a transistor 12, the collector of which is connected to B+. The emitter of transistor 12 is coupled to the base of a transistor 13, the collector of which is connected to B+ and the emitter of which is coupled to output terminal C of the comparator.

The base-emitter junction of transistor 7 is coupled across a diode-connected transistor 6. Diode 6 receives current from B+ by means of a resistor 21 coupled between terminals 50 and 51. The emitter of transistor 6 is coupled to the base of a diode-connected transistor 8, the emitter of which is coupled to ground. The emitter of transistor 6 is also coupled to the bases of transistors 9 and 10, the collectors of which are coupled to the emitters of transistors 12 and 13, respectively. The emitter of transistor 9 is coupled to ground by a resistor 24, and the emitter of transistor 10 is coupled to ground by a resistor 25.

In operation, resistor 21 causes a relatively constant current to flow through transistor 6 and a proportional current to flow in transistor 7 to supply operating current for the emitters of transistors 1 and 2. Both the current of resistor 21 and the emitter current of transistor 7 flow through diode 8 and cause transistors 9 and 10 to demand a pull-down current at their collectors.

An output is taken from the collector of transistor 2 by the current mirror consisting of transistors 3 and 4, and is combined in a push-pull manner with the collector output of transistor 1. The push-pull output is coupled to the output terminal by inverting amplifier transistor 11 and emitter follower transistors 12 and 13. Switching point compensation of the comparator is provided by the temperature-sensitive voltage characteristic of diode 5 connected in the path coupling the emitter of transistor 2 to the collector of transistor 7. Resistor 23 coupled in the path from the emitter of transistor 1 to the collector of transistor 7 is selected to equal the sum of the voltages across transistor 5 and resistor 22 for a particular temperature and at the desired operating current.

Summing voltages from the collector of transistor 7 to input terminal B for equal currents in transistors 1 and 2, $$V23 + VBE1 + VIN = VBE5 + V22 + VBE2 \tag{1}$$

where VIN is the input voltage V22 and V23 are the voltages across resistors 22 and 23, respectively, and VBE1 and VBE2 are the base-emitter offset voltages of transistors 1 and 2, respectively.

Assuming that the base-emitter voltages of transistors 1 and 2 are equal, $$V23 + VIN = VBE5 + V22 \quad (2)$$

and $$VIN = VBE5 + V22 - V23 \quad (3)$$

Since the currents on each side are one-half the collector current Io of transistor 7, $$VIN = VBE5 + Io/2 \, (R22 - R23) \quad (4)$$

By proper choice of current Io and of the resistance of resistors 22 and 23, the input voltage for current balance of the comparator may be made to be zero at a particular temperature. While resistor 22 can be have a magnitude of zero, a non-zero value aids in setting the gain of the comparator to the desired value. In any case, the temperature coefficient of the differential component between the input signal sources for which the comparator compensates will be the algebraic sum of the temperature coefficients of the terms on the right hand side of equation (4).

If the temperature coefficient of the compensation is to be controlled by the offset voltage of transistor 5, the remaining term on the right hand side of equation (4) must have a temperature coefficient which is substantially zero. If the temperature coefficient of resistors 22 and 23 is nominally zero, then it is only necessary to maintain collector current Io of transistor 7 substantially constant with temperature. However, in the event that the temperature coefficient of the resistors is other than zero, it may be necessary to provide the collector current of transistor 7 with either a positive or a negative temperature coefficient. A positive temperature coefficient for current Io may be readily accomplished by connecting a circuit arrangement such as 200 of FIG. 2a between terminals 50 and 51 of FIG. 1 in place of resistor 21.

Circuit arrangement 200 of FIG. 2a includes a resistor 221 connected to B+ through terminal 50. A plurality of series-connected diodes 201, 202 and 203 are connected in series between terminal 51 and the other end of resistor 221. With increasing temperature, the offset voltage of diodes 201 through 203 decreases, causing an increasing voltage across resistor 221 which creates a positive temperature coefficient for the current.

Alternatively, a negative temperature coefficient may be achieved by connecting a circuit such as 250 of FIG. 2b betwen terminals 50 and 51 of FIG. 1 in place of resistor 21. Circuit 250 includes a transistor 251 having its collector connected to terminal 51. The emitter of transistor 251 is connected to terminal 50 through a resistor 261. The base of transistor 251 is connected to ground by a resistor 255 and to terminal 50 by the series connection of a plurality of diodes 252 through 254. With increasing temperature, the offset voltage appearing across the series coupled diodes decreases. A portion of the decrease is coupled by the base-emitter junction of transistor 251 to resistor 261, thereby causing a negative temperature coefficient of current Io.

Further stabilization of the comparator by comparison with a more conventional arrangement is provided by the arrangement of transistors 6 through 10. Since the comparator is used for generating a pulse, pulldown transistors 9 and 10 are periodically saturated. When saturated, the current gain of transistors 9 and 10 decreases markedly, but in an amount which is not predictable or consistent. When saturated, the loading presented by the bases of transistors 9 and 10 therefore increases. By the arrangement of transistors 6 through 10, the effect of this loading on the collector current of transistor 7 is minimized.

In order to achieve a temperature compensation of less than one VBE, two VBE-related temperature responsive devices may be used, one in the emitter circuit of each of transistors 1 and 2. For example, a circuit such as that of FIG. 3 may be coupled between terminals 54 and 55 of FIG. 1 in place of, or in conjunction with resistor 23. The well-known circuit 300 of FIG. 3 includes a transistor 302 having a collector-emitter path coupled between terminals 54 and 55. A voltage divider consisting of series-coupled resistors 304 and 306 is also coupled between terminals 54 and 55, and the base of transistor 302 is coupled to the junction of the resistors. Circuit 300 is a feedback arrangement which varies the conduction of transistor 302 in such a manner as to maintain a voltage across terminals 54 and 55 equal to the base-emitter offset potential of the transistor multiplied by a constant factor dependent upon the voltage divider ratio. The net temperature correction of the comparator will be related to the difference between the temperature response of circuit 300 and that of diode 5.

When the loading at bases of transistors 9 and 10 increases, the voltage across transistor 8 tends to decrease. The amount of this change is inconsequently by comparison with the voltage established across resistor 21, and the current in this resistor will be substantially unaffected. The current mirror comprising diode 6 and transistor 7 will experience the voltage change across transistor 8 as a change in its common mode potential at the anode of diode 8. Transistor 7 will thus be subjected to a small change in its emitter to collector voltage which will cause only a negligible change in its collector current.

If instead, transistor 7 received base-emitter bias from diode 8, by a connection of the base-emitter junction of transistor 7 across diode 8, then the voltage change across diode 8 referred to above would cause a gross change in the collector current of transistor 7, as a result of the exponential character of the emitter-base control characteristic on collector current.

Other embodiments of the invention will be apparent to those skilled in the art. In particular, a temperature-responsive conducting device having a temperature coefficient opposite to that of transistor 5 may be connected in the emitter circuit of transistor 1 rather than 2 in order to accomplish the same correction. Other temperature-responsive devices, such as thermistors, may be used. Also, two temperature-responsive devices may be used, one in each emitter circuit, in order to achieve a net correction temperature coefficient which is the difference between the two. Other changes may also be advantageous, such as combining resistors 24 and 25 into a single resistor common to the emitter circuits of transistors 9 and 10.

What is claimed is:

1. An emitter coupled differential comparator arrangement in which changes in the switching point of said comparator result from a temperature-responsive differential-mode component between the sources being compared, comprising:

first and second transistors;

a current source;

means coupling said current source to the emitters of said first and second transistors by first and second current paths;

energization and utilization means coupled to the collector electrodes of said first and second transistors;

first and second voltage sources coupled to the bases of said first and second transistors, said first voltage source having a temperature-responsive differential-mode component relative to said second whereby said changes in said switching point result; and temperature-responsive conductive means coupled in said first current path for offsetting said differential comparator as a function of temperature to compensate for said temperature-responsive component between said sources for producing a component poled to reduce said temperature-dependent change in the switching point.

2. An emitter coupled differential comparator according to claim 1 further comprising second conductive means coupled in said second current path, said second conductive means having a temperature characteristic substantially less than that of said temperature-responsive conductive means for offsetting the component of said temperature-responsive conductive means at a particular temperature.

3. An emitter coupled differential comparator according to claim 2 wherein said component is a voltage.

4. An emitter coupled differential comparator according to claim 1 wherein said component is a voltage.

5. An emitter coupled differential comparator according to claim 4 wherein said temperature-responsive conductive means comprises a semiconductor diode.

6. An emitter coupled differential comparator according to claim 4 wherein said temperature-responsive conductive means comprises a semiconductor junction.

7. An emitter coupled differential comparator according to claim 6 further comprising second conductive means coupled in said second current path, said second conductive means having a temperature characteristic substantially less than that of said semiconductor junction for offsetting the voltage of said diode at a particular temperature.

8. An emitter coupled differential comparator according to claim 7 further comprising third conductive means having a temperature characteristic substantially less than that of said semiconductor junction coupled in said first current path for controlling the gain of said comparator.

9. An emitter coupled differential comparator in accordance with claim 8 wherein said semiconductor junction is a diode.

10. A comparator which compensates for relative differential-mode components of signal sources being compared, comprising:

first transistor means including a collector electrode and also including a base electrode coupled to a first signal source;

second transistor means including a collector electrode and also including a base electrode coupled to a second signal source having a temperature-responsive differential-mode component relative to said first signal source;

temperature-responsive conductive means including a first and second electrode and having a temperature characteristic substantially equal to the differential-mode component of said first and second signal source;

temperature-stable conductive means including first and second electrodes and having a temperature characteristic substantially less than that of said temperature-responsive conductive means;

first coupling means for coupling said first electrodes of said temperature-responsive and temperature-stable conductive means together at a junction;

a current source coupled to said juncture;

energizing and utilization means coupled to said collectors of said first and second transistor means; and second coupling means for coupling each of said second electrodes of said temperature-responsive and temperature-stable conductive means to respective emitter electrodes of said first and second transistor means in such a manner that said differential-mode component of said signal sources is compensated.

11. A temperature compensating comparator for use in conjunction with signal sources having a relative temperature-dependent differential-mode variation, comprising:

first transistor means including a base electrode coupled to a first signal source and further including emitter and collector electrodes;

second transistor means including a base electrode coupled to a second signal source having a temperature dependent differential-mode variation relative to said first signal source, and further including emitter and collector electrodes;

temperature-responsive conductive means having a temperature response characteristic substantially equal to the relative variation between said first and second signal sources;

temperature-stable conductive means having a temperature response substantially less than that of said temperature-responsive means;

a current source;

first coupling means for coupling said temperature-responsive and temperature-stable conducting means in parallel as to said current source and for providing currents at an electrode of said temperature-responsive conductive means and at an electrode of said temperature-stable means;

second coupling means for coupling said electrode of said temperature-responsive conductive means to said emitter of said first transistor means;

third coupling means for coupling said electrode of said temperature-stable conductive means to said emitter of said second transistor means; and utilization and supply means coupled to said collector electrodes of said first and second transistor means.

* * * * *